(12) United States Patent
Hoenigschmid

(10) Patent No.: US 7,400,521 B1
(45) Date of Patent: Jul. 15, 2008

(54) INTEGRATED CIRCUIT, MEMORY CHIP AND METHOD OF EVALUATING A MEMORY STATE OF A RESISTIVE MEMORY CELL

(75) Inventor: Heinz Hoenigschmid, Poecking (DE)

(73) Assignee: Qimoda AG, Munich (DE)

( * ) Notice: Subject to any disclaimer, the term of this patent is extended or adjusted under 35 U.S.C. 154(b) by 0 days.

(21) Appl. No.: 11/622,802

(22) Filed: Jan. 12, 2007

(51) Int. Cl.
*G11C 11/00* (2006.01)
(52) U.S. Cl. ...................... 365/148; 365/210
(58) Field of Classification Search .......... 365/148, 365/210
See application file for complete search history.

(56) References Cited

U.S. PATENT DOCUMENTS

| | | | |
|---|---|---|---|
| 5,828,616 A | 10/1998 | Bauer et al. | |
| 6,597,598 B1 | 7/2003 | Tran et al. | |
| 7,009,881 B2 * | 3/2006 | Noguchi | 365/185.17 |
| 2005/0276091 A1 * | 12/2005 | Inoue | 365/148 |
| 2006/0239066 A1 * | 10/2006 | Liaw | 365/171 |
| 2007/0165442 A1 * | 7/2007 | Hosoi et al. | 365/100 |
| 2008/0043521 A1 * | 2/2008 | Liaw et al. | 365/163 |

* cited by examiner

*Primary Examiner*—Michael T Tran
(74) *Attorney, Agent, or Firm*—Patterson & Sheridan, L.L.P.

(57) ABSTRACT

An integrated circuit comprises a resistive memory cell, at least one reference cell, a first device configured to apply a predetermined read voltage to the resistive memory cell and a second device configured to apply the predetermined read voltage to the reference cell. The resistive memory cell can be switched between a highly resistive memory state and at least one lowly resistive memory state. The reference cell comprises a resistance value representing a reference state. The first device generates the read voltage for a first resistance range, the first resistance range comprising the memory states of the resistive memory cell. The second device generates the read voltage for a second resistance range, the second resistance range being smaller in comparison to the first resistance range and comprising the reference state of the reference cell.

34 Claims, 5 Drawing Sheets

INTEGRATED CIRCUIT, MEMORY CHIP AND METHOD OF EVALUATING A MEMORY STATE OF A RESISTIVE MEMORY CELL

BACKGROUND OF THE INVENTION

1. Field of the Invention

The present invention relates to an integrated circuit comprising a resistive memory cell which can be switched between a highly resistive memory state and at least one lowly resistive memory state, and to a method of evaluating a memory state of a resistive memory cell. The invention further relates to a memory chip, an electronic device and a memory module.

2. Description of the Related Art

In various data processing systems and electronic devices, use is made of so-called non-volatile memory chips. These memories comprise programmable memory cells in which stored information is reliably maintained even without external power supply. Thereby, contrary to so-called volatile memories such as DRAMs (dynamic random access memory), no memory content is lost immediately upon switching off the supply voltage of the memory.

A type of non-volatile memory is the so-called flash memory. In this kind of memory, a single memory cell consists of a field effect transistor which comprises an isolated auxiliary electrode, called the "floating gate", between the gate and the source/drain channel of the transistor. In order to program the flash memory cell, a high positive potential is applied to the gate, thereby depositing electrical charge (electrons) on the auxiliary electrode. The uncharged state of the auxiliary electrode is restored by expelling the charge from the auxiliary electrode by means of applying a high negative potential to the gate. The charge on the auxiliary electrode thereby affects the conductivity or the resistance of the source/drain channel of the switched-on transistor, respectively, which is used for setting the memory state of the flash memory cell.

Moreover, non-volatile resistive memories are known which are based on the utilization of further electrical properties and phenomena. An exemplary one of these is the CBRAM memory (conductive bridging RAM) in which a memory cell comprises a resistive memory element with an electrolyte material arranged between two electrodes, the electrolyte material having a high specific resistance. By applying a programming voltage to the electrodes, a conductive path may be produced in the electrolyte material, causing the resistive memory cell to be switched from a highly resistive state to a lowly resistive state. Changing from the highly resistive state to the lowly resistive state may be reversed by applying a corresponding erase voltage. The different resistances thereby define detectable memory states of the memory cell.

A further resistive memory is the so-called phase change memory, also called PCRAM. In this memory, a memory cell comprises a resistive memory element with a phase change material, typically a metal alloy, arranged between two electrodes. By means of electrical pulses, the phase change material is heated and thereby switched between an (initially) amorphous phase state and a crystalline phase state. Depending on the phase state, the resistive memory cell is thereby transferred into a highly resistive memory state (amorphous phase) and into a lowly resistive memory state (crystalline phase), which is used for storing information.

For reading out information from a memory cell of a CBRAM or a PCRAM memory chip, a predetermined read voltage may be applied to the memory cell by means of a read circuit in order to generate an electrical current flow through the memory cell. The strength of the electrical current thereby depends on the resistive state of the resistive memory cell. By detecting an electrical quantity depending on the current, typically a voltage drop at a load element serially connected to the memory cell, the memory state of the memory cell may be evaluated. For this purpose, the electrical quantity is compared to a reference quantity. The reference quantity is usually obtained depending on an electrical current caused by applying the predetermined read voltage to two parallel-connected resistive memory cells, which serve as reference cells. Thereby, one of these reference cells is in a highly resistive state whereas the other reference cell is in a lowly resistive state so that the parallel-connected reference cells reflect a reference state at two parallel-connected load elements with a resistance value between the highly resistive and the lowly resistive memory state.

As the resistive states of a resistive memory cell of a CBRAM and of a PCRAM memory differ by several orders of magnitude, considerable deviations may occur between the voltage actually applied to the memory cell and the desired read voltage, depending on the voltage source used. Reliable evaluation of the memory state, however, requires the application of a constant and reproducible read voltage to the memory cell. For example, a small resistance value of the memory cell may result in a breakdown of a voltage applied to the memory cell, thus disabling any current flow required for evaluation. In order to avoid such interference in the case of CBRAM or PCRAM memory chips, the voltage applied to the resistive memory cell and the reference cells is regulated to the predetermined read voltage by means of voltage regulation circuits. A voltage regulation circuit usually comprises a fed-back operational amplifier and a regulation transistor connected to an output of the operational amplifier, which requires considerably complex circuitry.

Instead of using a memory cell of a memory chip as binary coded memory cell for storing one bit and of merely switching the memory cell between two different resistive states (logical "0" and logical "1"), it is possible to operate a memory cell as a so-called multi level cell (MLC) for storing several bits by means of a larger number of memory states. Storing of 2-bit information, for example, is carried out with the aid of four distinguishable resistive states of a memory cell.

A multi level operating mode of memory cells is known for flash memories. For evaluating a memory state of a flash memory cell, a predetermined read voltage is applied to the flash memory cell or to its source/drain channel, respectively, and an electrical quantity is detected depending on an electrical current caused thereby. The electrical quantity is compared to reference quantities of an electrical current generated by the application of the predetermined read voltage to reference cells. Thereby, the reference cells comprise reference states with resistance values between the individual memory states of the flash memory cell to be read out. In a 2-bit operating mode, for example, three reference cells comprising different reference states are employed in order to determine a respective memory state of the flash memory cell out of four possible memory states. The setting of the predetermined read voltage at the flash memory cell to be evaluated and at the reference cells is carried out by means of transistors which are operated as source followers.

The possibility of a multi level operating mode is also given with respect to a CBRAM and a PCRAM memory chip since a resistive memory cell may be switched between a highly resistive memory state and several lowly resistive memory states. For evaluating the memory state of a resistive memory cell, the read-out concept known for flash memories cannot be used, however, since, contrary to flash memory cells, the resistive states of resistive memory cells are within a resistance range which comprises several orders of magnitude, as described above. Setting the read voltage by means of transistors operated as source followers would thus result in a read voltage drop in lowly resistive memory states, thus affecting an evaluation or rendering it impossible. Although such an impairment may be compensated by means of the above-described voltage stabilization or voltage regulation, respectively, the application of voltage regulation circuits for memory cells as well as for reference cells would, however, cause a relatively complex circuitry and thus a relatively high demand for space for a memory chip providing a multi level operating mode.

BRIEF DESCRIPTION OF THE DRAWINGS

Various features of embodiments of the present invention will become clear from the following description, taking in conjunction with the accompanying drawings. It is to be noted, however, that the accompanying drawings illustrate only typical embodiments of the present invention and are, therefore, not to be considered limiting of the scope of the invention. The present invention may admit other equally effective embodiments.

DETAILED DESCRIPTION OF THE PREFERRED EMBODIMENT

Figure 1:
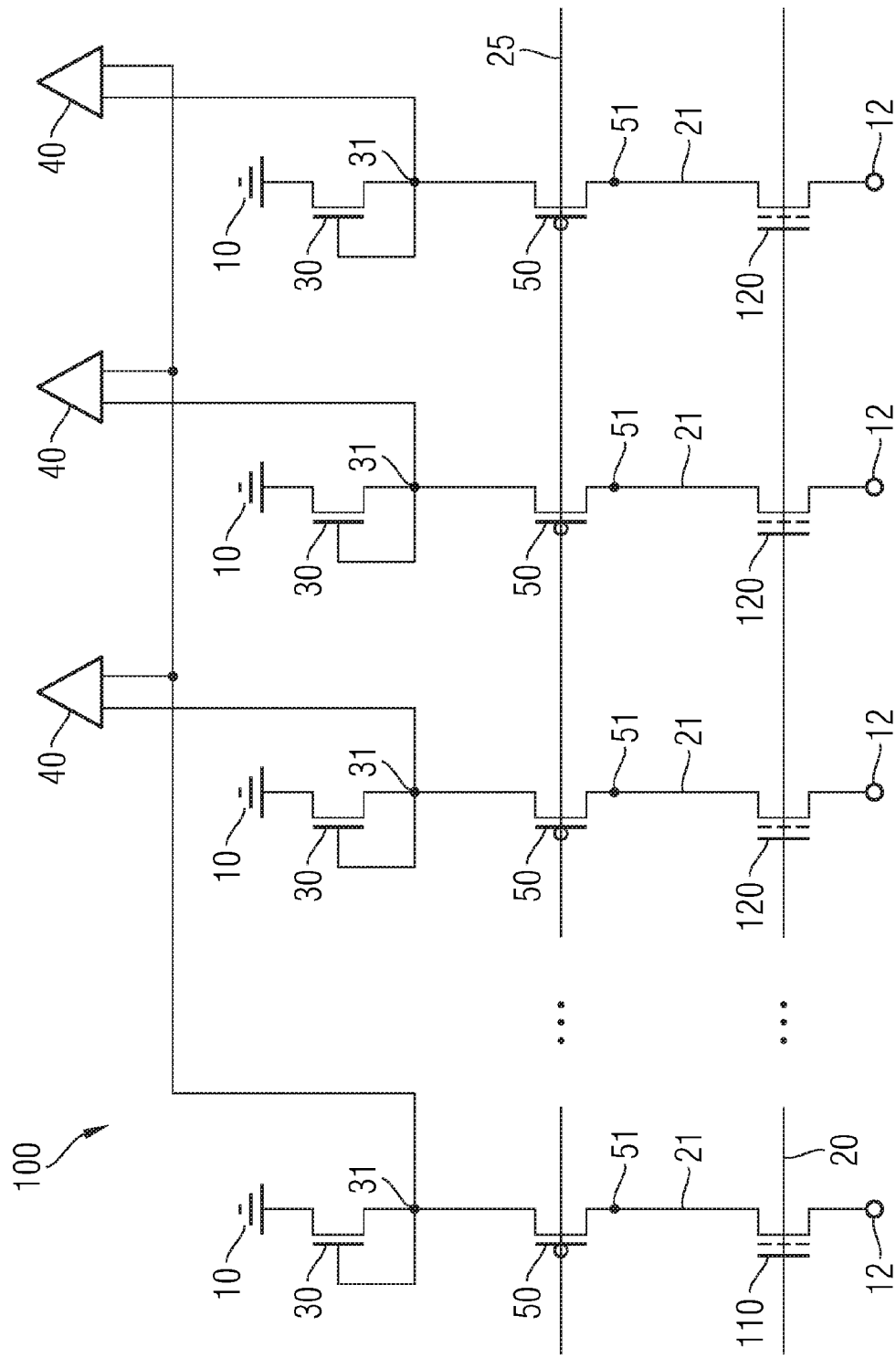
FIG. 1 is a schematic view of a conventional integrated circuit for reading out a flash memory cell operated as a multi level cell.

FIG. 1 is a schematic view of a conventional integrated circuit 100 for reading out a flash memory cell 110 which is operated as a multi level cell for storing 2-bit information. The memory cell 110 which is configured as a memory transistor may acquire one of four memory states with different resistance values of the source/drain channel, which may be evaluated by means of the circuit 100. For this purpose, three reference cells 120 are assigned to the memory cell 110, the reference cells 120 comprising reference states with resistance values between the individual memory states of the memory cell 110. As shown in FIG. 1, the reference cells 120 as well are flash memory cells which have been set to the corresponding various reference states.

The circuit 100 comprises a word line 20 which is connected to the gates of the memory cell 110 and of the reference cells 120. By applying an activation potential to the word line 20, the memory cell 110 and the reference cells 120 may be activated for evaluation.

A first terminal (source/drain) of the memory cell 110 and of the reference cells 120 is connected to a high potential 12, e.g. a supply voltage. A second terminal (source/drain) of the memory cell 110 and of the reference cells 120 is respectively connected to a corresponding one of bit lines 21. Each bit line 21 is connected to a first terminal (source/drain) of a corresponding one of p-channel transistors 50.

The transistors 50, which are operated as source followers, are connected to a control line 25 by their gates, and are respectively connected to a first terminal of a load element 30 via a first terminal (source/drain). The load elements 30 are presently configured as n-channel transistors formed as diodes, and are respectively connected to a ground potential 10 via a second terminal.

Furthermore, the circuit 100 comprises three sense amplifiers 40. Via the sense amplifiers 40, a potential is sensed at a node 31 or at the first terminal of the diode 30 of the conductive path of the memory cell 110, respectively, as well as at a node 31 or at the first terminal of a diode 30 of the conductive path of a reference cell 120, respectively. For this purpose, the sense amplifiers 40 are connected to the nodes 31 or to the first terminals of the diodes 30, respectively, via corresponding conductors.

When operating the circuit 100, the word line 20 is activated by applying an activation potential in order to activate the memory cell 110 and the reference cells 120 for evaluation. Moreover, the transistors 50 are switched on by applying a control potential to the control line 25.

In this manner, a predetermined potential is applied to the first terminals (source/drain) of the transistors 50 or to the bit lines 21 at the nodes 51, respectively, whereby a predetermined read voltage is set at the memory cell 110 and at the reference cells 120. This results in an electrical current flowing from the high potential 12 to the ground potential 10 in the conductive paths of the memory cell 110 and of the reference cells 120, respectively. Thereby, the strength of the current depends on the resistive states of the memory cell 110 and of the reference cells 120, and thus constitutes a respective voltage drop at the diodes 30, which may be sensed by means of a sense amplifier 40 by sensing the potential at a node 31.

By means of the sense amplifiers 40, the potential at the node 31 of the conductive path of the memory cell 110 may consequently be compared to the potentials at the nodes 31 of the conductive paths of the reference cells 120 in order to evaluate the memory state of the memory cell 110. Thereby each sense amplifier 40 amplifies a difference between the potential at the node 31 of the conductive path of the memory cell 110 and a respective potential at a node 31 of a conductive path of a reference cell 120. On the basis of the amplified potential differences, the memory state of the memory cell 110 may be determined.

A resistive memory cell, for example, a CBRAM and a PCRAM memory cell, respectively, also provides the possibility of being operated in a multi level mode. Thereby, advantage is taken of the fact that the resistive memory cell may be switched between a highly resistive memory state and several lowly resistive memory states. However, with regard to such a resistive memory cell, the integrated circuit 100 shown in FIG. 1 cannot be used for evaluating the memory state since, contrary to a flash memory cell, the resistive states of the memory cell are in a resistance range comprising several orders of magnitude. In the case of a lowly resistive state, the use of a transistor operated as a source follower for setting a read voltage at the resistive memory cell would result in the memory cell causing a voltage drop and thus disabling a current flow. In the inventive embodiments shown in the subsequent Figures, such an impairment is avoided with relatively low complexity of circuitry by providing different devices for applying the read voltage to resistive memory cells to be evaluated and to reference cells.

Figure 2:
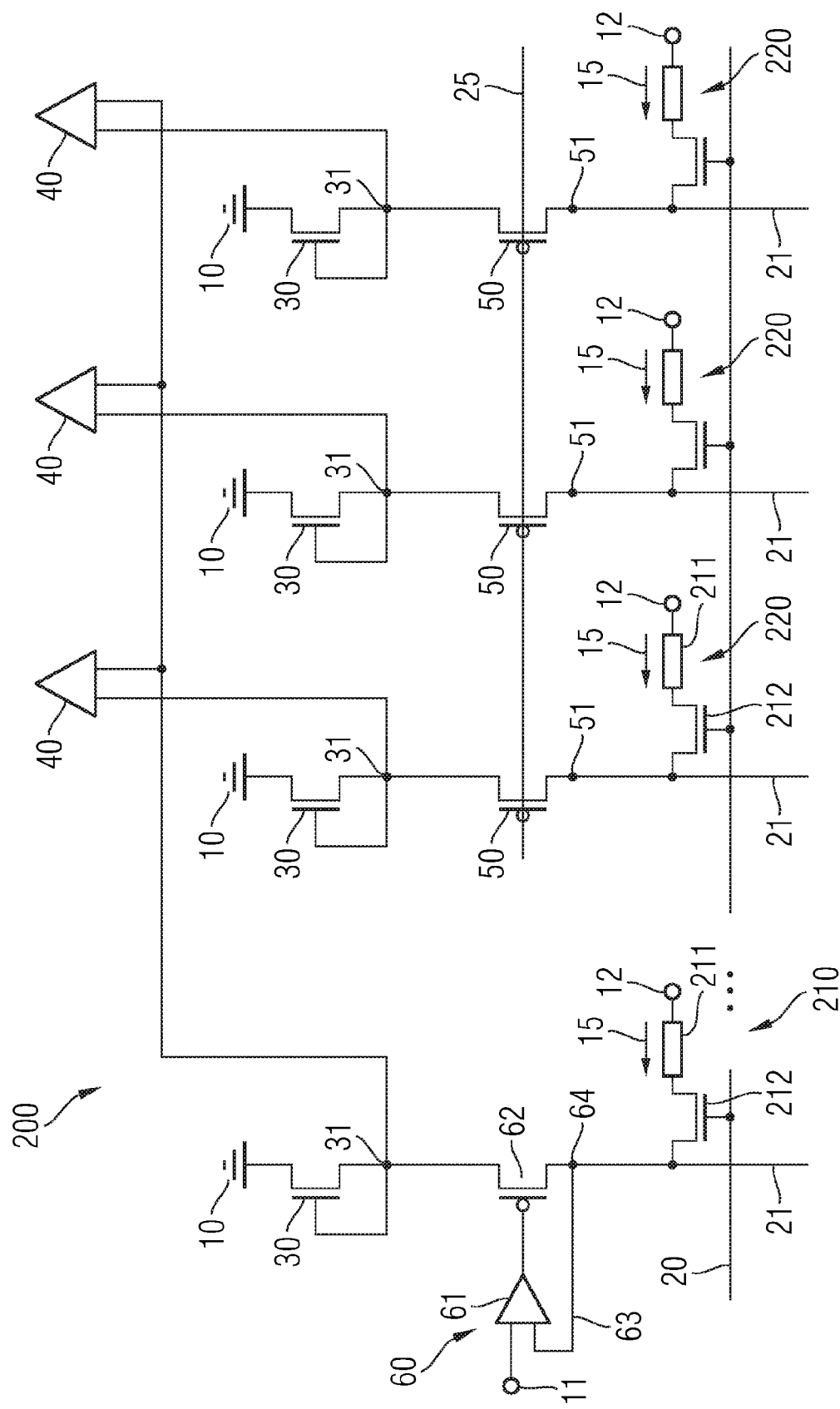
FIG. 2 is a schematic view of an integrated circuit for reading out a resistive memory cell operated as a multi level cell according to an embodiment of the present invention.

FIG. 2 shows a schematic view of an integrated circuit 200 for reading out a resistive memory cell 210 operated as a multi level cell, according to an embodiment of the invention. The memory cell 210 comprises a resistive memory element 211 as well as a selection transistor 212. The resistance of the resistive memory element 211 thereby defines the memory state of the memory cell 210.

For example, the memory cell 210 is a CBRAM memory cell in which the resistive memory element 211 comprises two electrodes and an electrolyte material with a high specific resistance arranged between the electrodes (not shown). The memory cell 210 is therefore in a highly resistive memory state, provided that the resistive memory element 211 is not programmed. By applying voltages to the electrodes by means of circuit elements not indicated in FIG. 2, it is possible to produce a conductive path in the electrolyte material and to clear it away again, respectively. Depending on the degree to which the conductive path has been formed in the electrolyte material of the resistive memory element 211, the memory cell 210 has one of several lowly resistive memory states.

The memory cell 210 shown in FIG. 2 is set, for example, to one of four possible memory states for storing 2-bit information, i.e., the memory cell 210 is switchable between the highly resistive memory state and three lowly resistive memory states. The highly resistive memory state of the memory cell 210, for example, corresponds to an effective electrical resistance of 1 G$\Omega$, whereas the lowly resistive memory states of the memory cell 210 correspond to resistance values in the k$\Omega$ range, for example, 10 k$\Omega$, 30 k$\Omega$ and 50 k$\Omega$. Alternatively, the highly resistive memory state of the memory cell 210 may correspond to a different effective electrical resistance, and the lowly resistive memory states may correspond to other resistance values in a different resistance range.

An evaluation of the memory state of the memory cell 210 is carried out by means of three reference cells 220 assigned to the memory cell 210, the reference cells 220 comprising different resistance values representing reference states between the individual memory states of the memory cell 210. All reference states may be in a resistance range which is lowly resistive compared to the highly resistive memory state of the memory cell 210 and relatively small, i.e. a two-digit k$\Omega$ range, and correspond to effective electrical resistances of e.g. 20 k$\Omega$, 40 k$\Omega$ and 80 k$\Omega$. Alternatively, the reference states may be in a different resistance range and correspond to other effective electrical resistances.

The reference cells 220 are resistive memory cells, as shown in FIG. 2, each reference cell 220 comprising a resistive memory element 211 and a selection transistor 212, and are switched into the corresponding different reference states. In this manner, high reliability may be achieved when evaluating the memory state of the memory cell 210, since process deviations occurring in a manufacturing process of the memory cell 210 and influencing the electrical properties of the memory cell 210 exist correspondingly in the manufacture of the reference cells 220.

In the memory cell 210 as well as in the reference cells 220, a first terminal of the resistive memory element 211 is connected to a high potential 12 and a second terminal of the resistive memory element 211 is connected to a first source/drain terminal of the selection transistor 212. The potential 12 is also called a plate potential. A second source/drain terminal of each selection transistor 212 is connected to a respective bit line 21, and a gate of each selection transistor 212 is connected to a word line 20.

The further structure of the conductive paths of the reference cells 220 corresponds to the structure of the conductive paths of the conventional circuit 100 shown in FIG. 1. A bit line 21 is respectively connected to a first source/drain terminal of a p-channel transistor 50, the transistor 50 being operated as a source follower. A gate of a transistor 50 is respectively connected to a control line 25, and a second source/drain terminal of a transistor 50 is respectively connected to a first terminal of an n-channel transistor configured as a diode 30 (load element). A ground potential 10 is respectively applied to a second terminal of a diode 30. A voltage drop at a diode 30 is respectively sensed by one of three sense amplifiers 40. The sense amplifiers 40 are thus connected to a terminal of a diode 30 or to a node 31 between a diode 30 and a transistor 50, respectively, by corresponding conductors in order to sense a potential at a node 31.

Contrary thereto, instead of a transistor 50 operated as a source follower, a voltage regulation circuit 60 is provided in the conductive path of the memory cell 210 to be read out. The voltage regulation circuit 60 comprises a fed-back operational amplifier 61 and a regulation transistor 62. The regulation transistor 62 is configured as p-channel transistor. Thereby, the source/drain terminals of the regulation transistor 62 are connected to a bit line 21 and to an n-channel diode 30, and the gate of the regulation transistor 62 is connected to an output of the operational amplifier 61. To a first input of the operational amplifier 61, a constant reference potential 11 is applied. Via a feed back line 63, a potential at a source/drain terminal of the regulation transistor 62 or at a node 64 of the bit line 21, respectively, is applied to a second input of the operational amplifier 61.

For sensing a voltage drop at the diode 30 of the conductive path of the memory cell 210, the three sense amplifiers 40 are connected to the associated terminal of the diode 30 or the node 31 between the diode 30 and the regulation transistor 62, respectively, via corresponding conductors. To a second terminal of the diode 30, the ground potential 10 is applied.

For evaluating the memory state of the memory cell 210, the word line 20 is activated by applying a corresponding activation potential whereby the selection transistors 212 of the memory cell 210 and of the reference cells 220 are switched on. In this way, the resistive memory elements 211 of the memory cell 210 and of the reference cells 220 are conductively connected to the bit lines 21 via the switched-on selection transistors 212.

Moreover, a predetermined read voltage 15 is applied to the memory cell 210 as well as to the reference cells 220 in order to cause an electrical current to flow in the individual conductive paths from the high potential 12 to the ground potential 10, the strength of the current depending on the resistive states of the memory cell 210 and of the reference cells 220, respectively. Thereby, the read voltage 15 essentially occurs on the resistive memory elements 211, as indicated in FIG. 2 by arrows.

Due to the fact that all reference states of the reference cells 220 may be within a lowly resistive and relatively small resistance range, the predetermined read voltage 15 may be set reliably and without complex circuitry and with little spatial demands, respectively, by means of the transistors 50 at the reference cells 220, the transistors 50 being operated as source followers. Thereby, a read voltage 15 at a reference cell 220 essentially corresponds to the difference between the high potential 12 and a potential on the corresponding bit line 21 which is lower than the potential 12, i.e. a potential at a node 51 or at a source/drain terminal of a transistor 50, respectively. Thus, a control potential is applied to the control line 25 connected to the gate of a transistor 50, which corresponds to the sum of the potential at a node 51 determining the read voltage 15 and a gate source voltage occurring on a transistor 50. In this way, the potential at a node 51 and thus, the predetermined read voltage 15 at a reference cell 220 is reliably set for all reference states.

The voltage applied to the memory cell 210 essentially corresponds to the difference between the high potential 12 and a potential on the bit line 21, i.e. a potential at the node 64 or a source/drain terminal of the regulation transistor 62, respectively. The potential at the node 64 is applied to the second input of the operational amplifier 61 via the feed back line 63. As is typical for such a circuitry, the operational amplifier 61 attempts to regulate the potential at the node 64 to the reference potential 11, the reference potential being applied to the first input of the operational amplifier 61. The reference potential 11 is thereby set with regard to the predetermined read voltage 15. In this manner, the potential at the node 64 is regulated to the reference potential 11, and thus the voltage applied to the memory cell 210 is reliably regulated to the predetermined read voltage 15. This applies to a relatively large resistance range comprising the highly resistive memory state as well as the lowly resistive memory states of the memory cell 210. With respect to a lowly resistive memory state of the memory cell 210, a breakdown of the voltage may be compensated by means of the voltage regulation circuit 60 by increasing the voltage to the predetermined read voltage 15.

The electrical current in the individual conductive paths causes a voltage drop at the diodes 30 assigned to the memory cell 210 and the reference cells 220 and thus the strength of the potentials at the terminals of the diodes 30 or at the nodes 31, respectively, which in turn is sensed by the sense amplifiers 40. Thereby, the potentials at the nodes 31 of the conductive paths of the reference cells 220 are respectively sensed by one of the three sense amplifiers 40, and the potential at the node 31 of the conductive path of the memory cell 210 is sensed by all three sense amplifiers 40 in order to compare the potentials. The respective differences of the potentials determined at the nodes 31 are amplified by the sense amplifiers 40. Based on the amplified potential differences, the memory state of the memory cell 210 may be evaluated.

Figure 3:
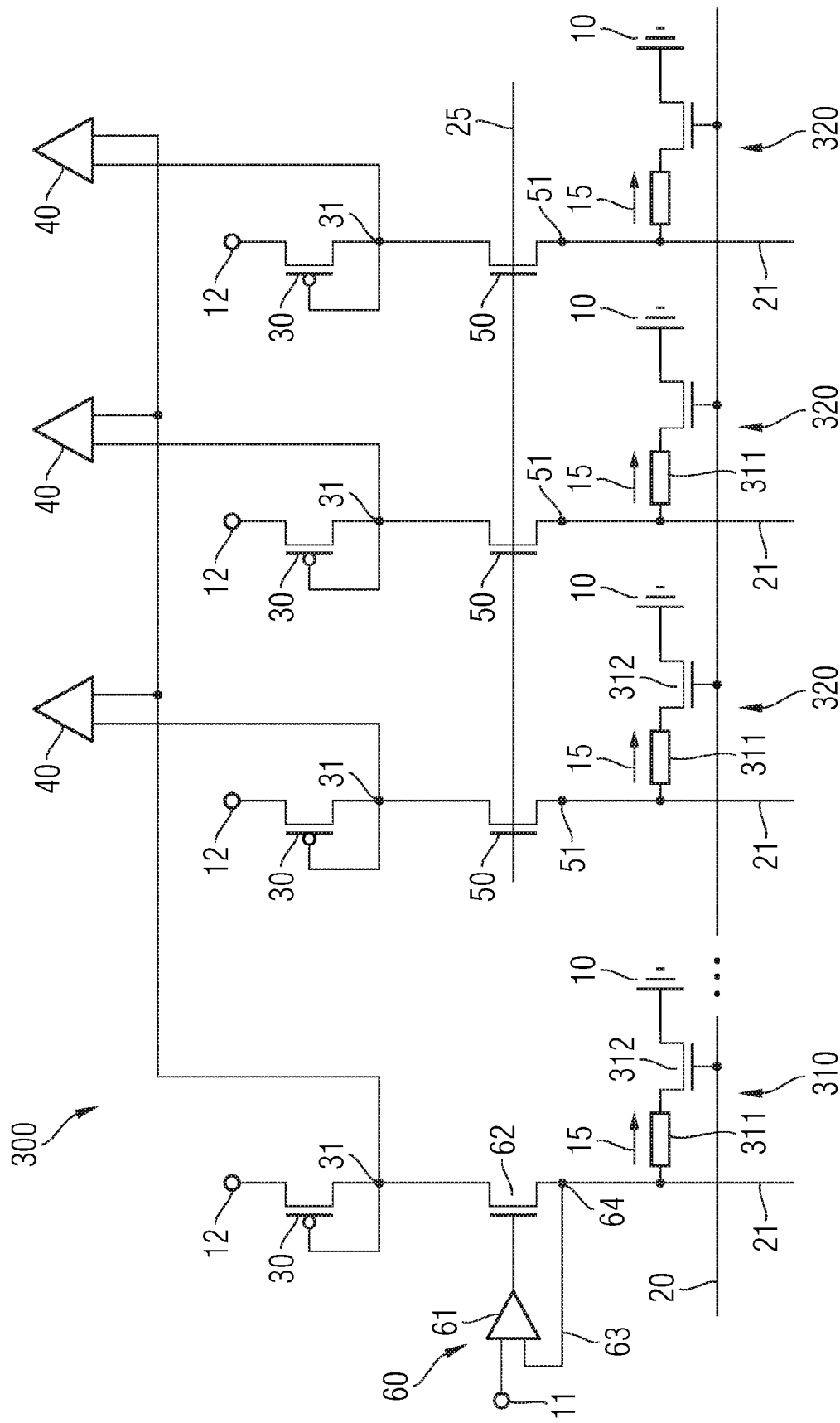
FIG. 3 is a schematic view of an integrated circuit for reading out a resistive memory cell operated as a multi level cell according to another embodiment of the present invention.

FIG. 3 shows a schematic view of an integrated circuit 300 for reading out a resistive memory cell 310 operated as a multi level cell according to a further embodiment of the present invention. The design of the circuit 300 and its functionality essentially correspond to the circuit 200 shown in FIG. 2.

The memory cell 310, which comprises a resistive memory element 311 and a selection transistor 312, is e.g. a PCRAM memory cell. Thereby, the resistive memory element 311 comprises two electrodes and a phase change material arranged between the electrodes (not shown). By applying electrical pulses to the electrodes by means of circuit elements not shown in FIG. 3, the phase change material may be heated, thus switching the phase change material between an amorphous and a crystalline phase state. Depending on the degree to which the crystalline phase state has developed, the memory cell 310 may comprise, apart from a highly resistive memory state, one of several lowly resistive memory states.

Also in the circuit 300 shown in FIG. 3, the memory cell 310 is e.g. set to one of four possible memory states for storing 2-bit information, i.e. the memory cell 310 may be switched between the highly resistive memory state and three lowly resistive memory states. For example, the highly resistive memory state of the memory cell 310 corresponds to an effective electrical resistance of 1 M$\Omega$, whereas the lowly resistive memory states of the memory cell 310 correspond to resistance values in the k$\Omega$ range, for example, 1 k$\Omega$, 3 k$\Omega$ and 5 k$\Omega$. Alternatively, the highly resistive memory state of the memory cell 310 may correspond to a different effective electrical resistance, and the lowly resistive memory states may correspond to other resistance values in a different resistance range.

An evaluation of the memory state of the memory cell 310 is in turn carried out by means of three reference cells 320 associated with the memory cell 310, the reference cells 320 comprising reference states with resistance values between the individual memory states of the memory cell 310. The reference states of the reference cells 320 may be in a resistance range which is lowly resistive compared to the highly resistive memory state of the memory cell 310 and relatively small, i.e. in the k$\Omega$-range, and correspond to effective electrical resistances of e.g. 2 k$\Omega$, 4 k$\Omega$ and 8 k$\Omega$. Alternatively, the reference states may be in a different resistance range and correspond to other effective electrical resistances. As indicated in FIG. 3, the reference cells 320 are resistive memory cells, each reference cell 320 comprising a resistive memory element 311 and a selection transistor 312, and are set to the corresponding different reference states.

The differences compared to the circuit 200 of FIG. 2 are essentially the swapping of the potentials 10 and 12 in the individual conductive paths, and the different arrangement of the resistive memory element 311 and of the selection transistor 312 in a memory cell 310 or a reference cell 320, respectively. Thus, in the circuit 300, diodes 30 serving as load elements and presently formed by p-channel transistors are connected to a high potential 12, and the memory cell 310 and the reference cells 320, respectively, are connected to a ground potential 10. Moreover, a resistive memory element 311 of the memory cell 310 and of the reference cells 320 is directly connected to a bit line 21, whereas a selection transistor 312 addressable via a word line 20 is connected to the ground potential 10.

In the conductive paths of the reference cells 320, transistors 50 operated as source followers are utilized for setting a potential adjusted to a predetermined read voltage 15 at the bit lines 21 or at nodes 51, respectively, and thus for setting the read voltage 15 at the reference cells 320. In one embodiment, the transistors 50 are transistors of the n-channel type. The gates of the transistors 50 are in turn connected to a control line 25.

Since all reference states of the reference cells 320 may be within a lowly resistive and relatively small resistance range, the predetermined read voltage 15 may be reliably set at the reference cells 320 by means of the transistors 50. Thereby, a read voltage 15 at a reference cell 320 essentially corresponds to the difference between a potential on the corresponding bit line 21 which is higher than the ground potential 10, i.e., between a potential at a node 51 or at the source/drain terminal of a transistor 50, respectively, and the ground potential 10. Due to the potentials 10, 12 which have been swapped compared to the circuit 200 of FIG. 2, the arrows indicating a read voltage 15 in FIG. 3 run in a reversed direction compared to FIG. 2.

In the conductive path of the memory cell 310, on the other hand, a voltage regulation circuit 60 comprising a fed-back operational amplifier 61 and a regulation transistor 62 connected to an output of the operational amplifier 61 are provided. In one embodiment, the regulation transistor 62 is a transistor of the n-channel type. At a first input of the operational amplifier 61, a reference potential 11 adjusted to the predetermined read voltage 15, and at a second input of the operational amplifier 61 via a feed back line 63, a potential applied at a node 64 of the bit line 21 are applied. The potential at the node 64 is thus regulated to the reference potential 11 and thereby, the voltage applied to the memory cell 310 is reliably regulated to the predetermined read voltage 15. The read voltage 15 at the memory cell 310 thereby essentially corresponds to the difference between the potential at the node 64 and the ground potential 10. The regulation of the voltage at the memory cell 310 to the predetermined read voltage by means of the voltage regulation circuit 60 is possible for a relatively large resistance range, which comprises the highly resistive memory state as well as the lowly resistive memory states of the memory cell 310. In this way, a breakdown of the read voltage 15 in the case of a lowly resistive memory state of the memory cell 310 is compensated.

An evaluation of the memory state of the memory cell 310 is carried out by means of three sense amplifiers 40, the sense amplifiers 40 sensing a voltage drop at diodes 30 in the individual conductive paths caused by a current flow. Therefore, potentials at the nodes 31 of the conductive paths of the reference cells 320 are respectively applied to one of the three sense amplifiers 40, and the potential at a node 31 of the conductive path of the memory cell 310 is applied to all three sense amplifiers 40. The respective differences of the potentials at the nodes 31 are amplified by the sense amplifiers 40. On the basis of the amplified potential differences, the memory state of the memory cell 310 may be determined.

Figure 4:
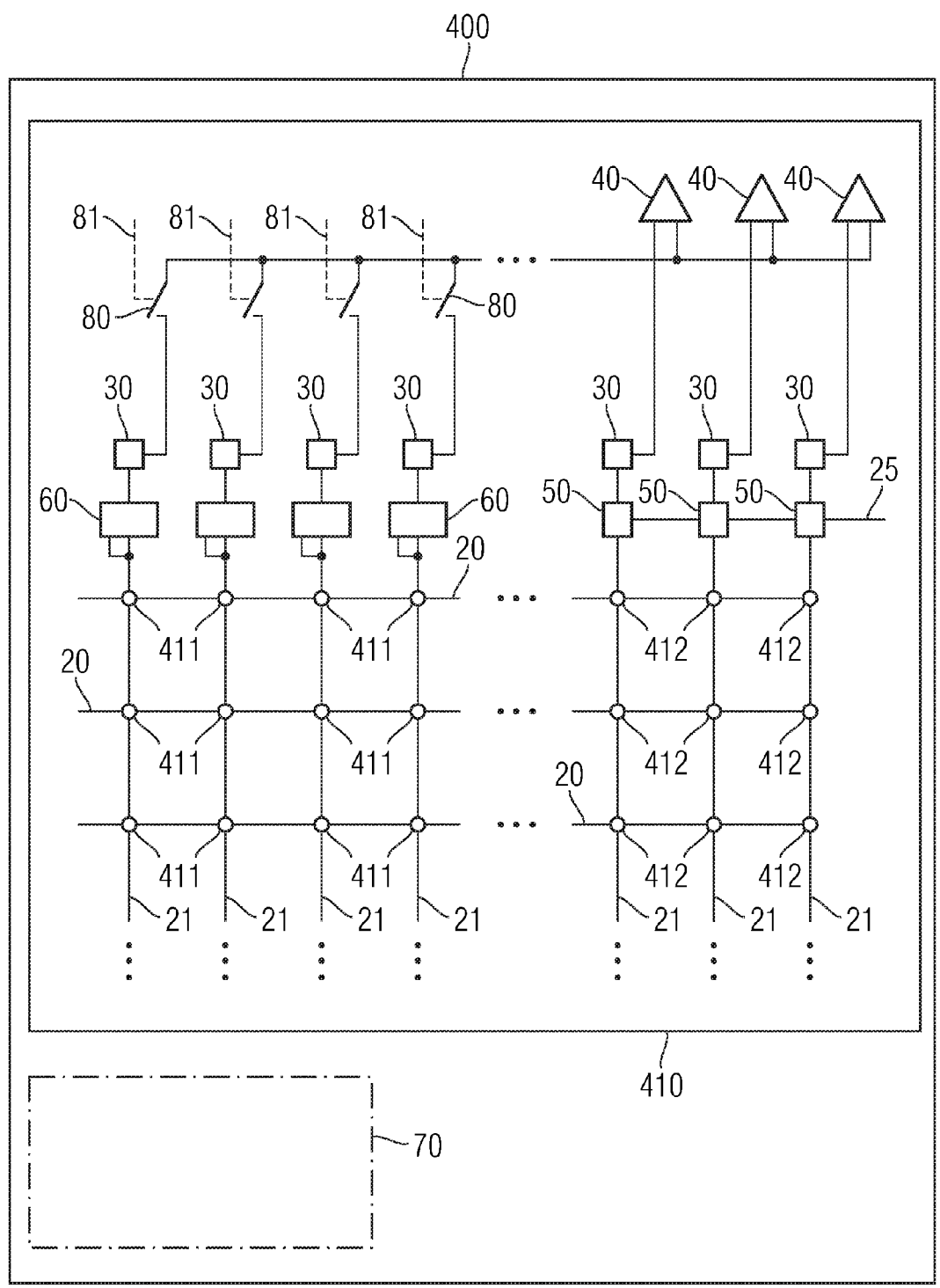
FIG. 4 is a schematic view of an electronic device comprising a memory chip according to an embodiment of the present invention.

FIG. 4 shows a schematic view of an electronic device 400 comprising a memory chip 410 according to an embodiment of the present invention. The electronic device 400 may be, for example, a memory module comprising the memory chip 410 or several memory chips 410, respectively. Alternatively, the electronic device 400 may also be a printed circuit board or a main board of a computer. The electronic device 400 may comprise further components apart form the memory chip 410 or the several memory chips 410, such as a control unit 70 which is indicated in FIG. 4.

The memory chip 410 of the device 400 comprises a circuit design corresponding to the circuit 200 or 300, respectively, of FIGS. 2 and 3 with a plurality of resistive memory cells 411 and reference cells 412. The memory cells 411 and reference cells 412 are arranged in a matrix in the shape of rows and columns at cross points of a plurality of word lines 20 and bit lines 21, each memory cell 411 and each reference cell 412 comprising a resistive memory element and a selection transistor. The memory cells 411 and the reference cells 412 may be CBRAM as well as PCRAM memory cells. For reasons of clarity, FIG. 4 only shows three rows or word lines 20, respectively, and seven columns or bit lines 21, respectively. Furthermore, potentials 10 and 12 applied to the individual conductive paths are not illustrated.

A memory cell 411 may be switched between a highly resistive memory state and three lowly resistive memory states. Therefore, three reference cells 412 arranged at a word line 20 are assigned to the memory cells 411 arranged at this word line 20, respectively. With regard to each row, the three corresponding reference cells 412 comprise different resistance values or reference states, respectively, between the individual memory states of a memory cell 411. The reference states may be in a lowly resistive resistance range.

For regulating a read voltage of the resistive memory cells 411 arranged at the bit lines 21, voltage regulation circuits 60 are provided. The voltage regulation circuits 60 may each comprise an operational amplifier and a regulation transistor and are connected to the respective bit lines 21 of the conductive paths of the memory cells 411. For setting the read voltage of the reference cells 412 arranged at the bit lines 21, three transistors 50 operated as source followers are provided which are connected to the respective bit lines 21 of the conductive paths of the reference cells 412 and to a control line 25.

The voltage regulation circuits 60 as well as the transistors 50 are furthermore connected to diodes 30 serving as load elements according to the circuits 200 or 300, respectively, of FIGS. 2 and 3. Voltage drops at the diodes 30 are sensed by three sense amplifiers 40 via corresponding conductors. Thereby, the voltage drops at the diodes 30 of the conductive paths of the reference cells 412 are respectively detected by one of the sense amplifiers 40. The voltage drops at the diodes 30 of the conductive paths of the memory cells 411 may be selectively sensed by the three sense amplifiers 40 by means of switching elements 80 arranged in the conductive paths between the diodes 30 and the sense amplifiers 40. A switching element 80 may be configured as a switching transistor and is activated by a corresponding selection line 81.

In order to evaluate the memory state of a memory cell 411 arranged in a specific row and column, the corresponding word line 20 is activated. In this way, the resistive memory elements of all memory cells 411 and reference cells 412 of the selected row are conductively connected to the bit lines 21 or ground potentials 10, respectively, via the associated switched-on selection transistors, thus causing a current to flow in the individual conductive paths which depends on the respective resistive states of the memory cells 411 and of the reference cells 412.

Furthermore, a switching element 80 of the column belonging to the memory cell 411 to be read out is activated by means of the corresponding selection line 81. In this way, the voltage drop at the diode 30 of the respective column caused by the electrical current is detected by all three sense amplifiers 40. Moreover, the voltage drops at the diodes 30 of the conductive paths of the reference cells 412 are sensed by the sense amplifiers 40. Thereby, potential differences between the diodes 30 of the individual conductive paths are amplified by the sense amplifiers 40, as described above with reference to FIGS. 2 and 3.

On the basis of the potential differences amplified by the sense amplifiers 40, the control unit 70 may evaluate the memory state of the selected memory cell 411. The described activation of a word line 20 and of a switching element 80 by means of the corresponding selection line 81 may also be carried out or initiated by the control unit 70.

Figure 5:
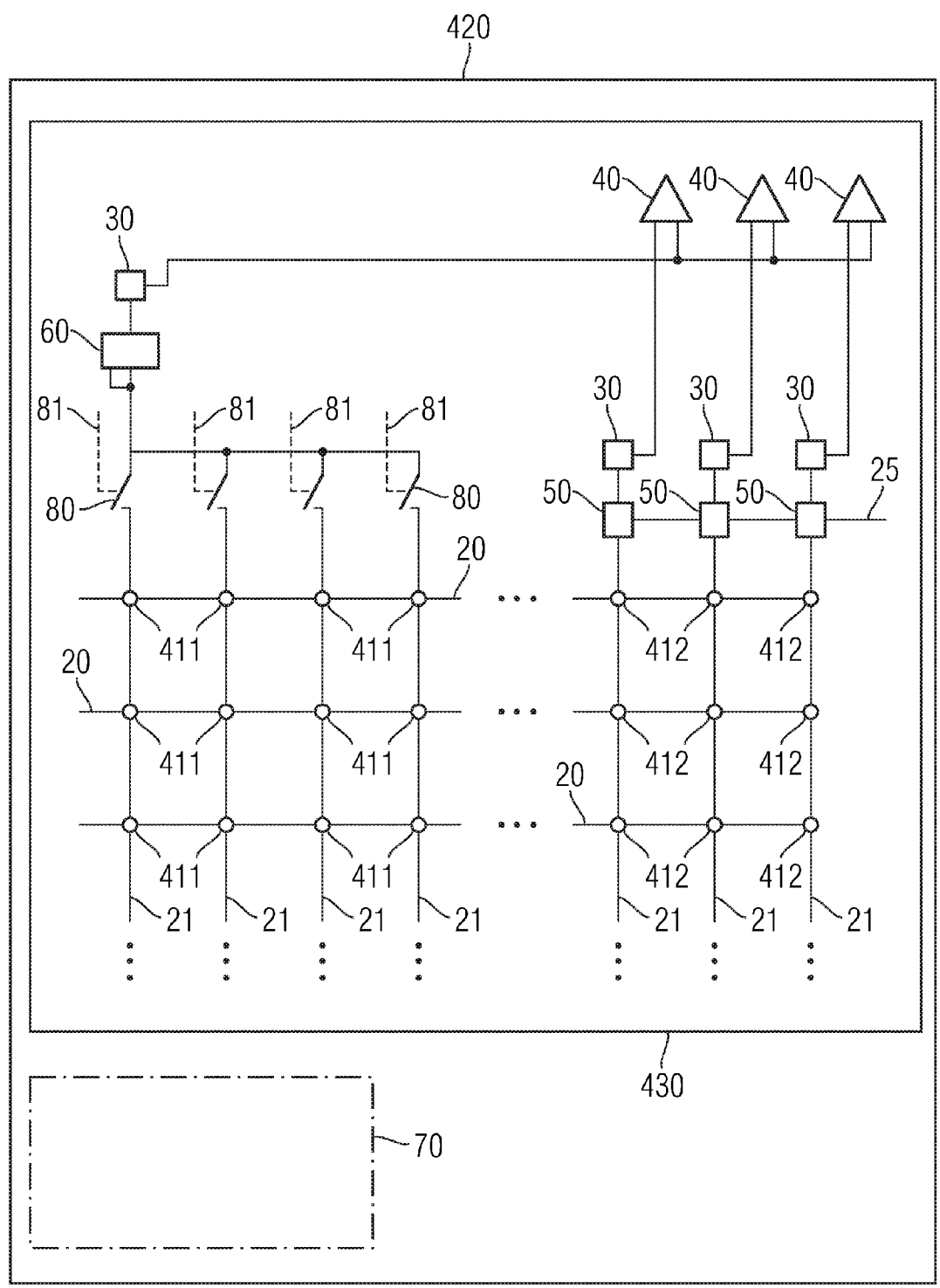
FIG. 5 is a schematic view of an electronic device comprising a memory chip according to another embodiment of the present invention.

FIG. 5 shows a schematic view of an electronic device 420 comprising a memory chip 430 according to a further embodiment of the present invention. The device 420 may also be e.g. a memory module with one or several memory chips 430, respectively, as well as a main board with one or several memory chips 430, respectively, and, as the case may be, further components such as a control unit 70.

The memory chip 430 essentially comprises the same design and the same functionality as the memory chip 410 illustrated in FIG. 4. Unlike the memory chip 410, however, only one voltage regulation circuit 60 and one diode 30 are provided in the memory chip 430 of FIG. 5 for all resistive memory cells 411. As a consequence, the memory chip 430 is characterized by a low spatial demand and circuit complexity. The voltage regulation circuit 60 is switcheably connected to the bit lines 21 of the conductive paths of the memory cells 411 via switching elements 80. A switching element 80 is in turn activated by means of a corresponding selection line 81.

The embodiments described with reference to FIGS. 2 to 5 are exemplary embodiments of the present invention. Moreover, further embodiments may be realized comprising further variations of the invention.

For example, reference cells may be configured as fixed electrical resistors instead of using resistive memory cells as reference cells. Furthermore, load elements at which a voltage drop is sensed can be realized with the aid of circuit elements different from transistors or diodes, respectively, e.g., with the aid of resistive elements.

Moreover, a memory chip may have a design in which the circuit structure of the memory chips 410, 430 shown in FIGS. 4 and 5 is repeated several times in the row direction with memory cells 411 arranged at a word line 20, three reference cells 412 assigned to the memory cells 411, the voltage regulation circuit(s) 60, the three transistors 50, the diodes 30 and the three sense amplifiers 40.

Furthermore, a voltage regulation circuit may be configured with a design differing from that illustrated in FIGS. 2 and 3. For example, it is possible to provide circuit elements instead of an operational amplifier, the circuit elements comparing a potential applied to a bit line with a reference potential for voltage regulation according to an operational amplifier.

Furthermore, it is possible to operate resistive memory cells as multi level cells for storing more than two bits. Generally, storage of n-bit information may be realized by means of $2^n$ distinguishable memory states of a memory cell or a highly resistive and $(2^n-1)$ lowly resistive memory states of a memory cell, respectively. An evaluation of the memory state of a memory cell may thereby be carried out by means of $(2^n-1)$ reference cells which comprise differing resistance values or reference states, respectively, between the individual memory states of the memory cell. Correspondingly, $(2^n-1)$ sense amplifiers may therefore be used.

In addition, the described embodiments are not limited to memory cells of the CBRAM-type or PCRAM-type, respectively. Embodiments of the invention may be realized including further resistive memory concepts, at which the generation of distinguishable resistive states of a memory cell is based on other electrical phenomena and properties. For example, memories based on the utilization of transfer metal oxides are also contemplated.

The preceding description describes advantageous exemplary embodiments of the invention. The features disclosed therein and the claims and the drawings can, therefore, be useful for realizing the invention in its various embodiments, both individually and in any combination. While the foregoing is directed to embodiments of the present invention, other and further embodiments of this invention may be devised without departing from the basic scope of the invention, the scope of the present invention being determined by the claims that follow.

What is claimed is:

1. An integrated circuit, comprising:
    a resistive memory cell configured to be switched between a highly resistive memory state and at least one lowly resistive memory state;
    at least one reference cell, wherein the reference cell comprises a resistance value representing a reference state;
    a first device configured to apply a predetermined read voltage to the resistive memory cell, wherein the first device generates the read voltage for a first resistance range, the first resistance range comprising the memory states of the resistive memory cell; and
    a second device configured to apply the predetermined read voltage to the reference cell, wherein the second device generates the read voltage for a second resistance range, the second resistance range being smaller in comparison to the first resistance range and comprising the reference state of the reference cell.

2. The integrated circuit according to claim 1, wherein the first device comprises a voltage regulation circuit configured to regulate a voltage applied to the resistive memory cell to the predetermined read voltage.

3. The integrated circuit according to claim 2, wherein the voltage regulation circuit comprises a fed-back operational amplifier and a regulation transistor connected to the operational amplifier.

4. The integrated circuit according to claim 1, wherein the second device comprises a transistor configured to operate as a source follower to set the read voltage at the reference cell.

5. The integrated circuit according to claim 1, wherein the resistive memory cell is configured to be switched between one highly resistive memory state and three lowly resistive memory states.

6. The integrated circuit according to claim 5, wherein three reference cells are assigned to the resistive memory cell, wherein the three reference cells comprise three different resistance values representing three different reference states between the individual memory states of the resistive memory cell, and wherein the second resistance range of the second device comprises the three different reference states.

7. The integrated circuit according to claim 1, wherein the resistive memory cell comprises a resistive memory element and a selection transistor.

8. The integrated circuit according to claim 1, wherein the reference cell is a resistive memory cell switched into a reference state.

9. A memory chip, comprising:
    a plurality of word lines and bit lines;
    a plurality of resistive memory cells, wherein a respective resistive memory cell is arranged at a cross point of a respective word line and a respective bit line and is configured to be switched between a highly resistive memory state and at least one lowly resistive memory state;
    a plurality of reference cells, wherein a respective reference cell is arranged at a cross point of a respective word line and a respective bit line and comprises a respective resistance value representing a respective reference state;
    a first device configured to apply a predetermined read voltage to a respective resistive memory cell, thereby causing an electrical current to flow in the respective bit line assigned to the respective resistive memory cell, wherein the first device generates the read voltage for a first resistance range, the first resistance range comprising the memory states of the resistive memory cell;
    a second device configured to apply the predetermined read voltage to the respective reference cell, thereby causing an electrical current to flow in the respective bit line assigned to the respective reference cell, wherein the second device generates the read voltage for a second resistance range, the second resistance range being smaller in comparison to the first resistance range and comprising the respective reference state of the respective reference cell; and
    an evaluation device configured to evaluate memory states of the resistive memory cells.

10. The memory chip according to claim 9, wherein the first device comprises a voltage regulation circuit configured to regulate a voltage applied to the respective resistive memory cell to the predetermined read voltage.

11. The memory chip according to claim 10, wherein the voltage regulation circuit comprises a fed-back operational amplifier and a regulation transistor connected to the operational amplifier.

12. The memory chip according to claim 10, wherein the voltage regulation circuit is connected to a respective bit line for regulating the voltage of resistive memory cells arranged at the respective bit line.

13. The memory chip according to claim 10, wherein the voltage regulation unit is connected to the respective bit lines via switching elements.

14. The memory chip according to claim 9, wherein the second device comprises a transistor configured to operate as a source follower to set the read voltage at a respective reference cell.

15. The memory chip according to claim 14, wherein the transistor configured to operate as the source follower is connected to a respective bit line for setting the read voltage of reference cells arranged at the respective bit line.

16. The memory chip according to claim 9, wherein each resistive memory cell is configured to be switched between one highly resistive memory state and three lowly resistive memory states.

17. The memory chip according to claim 16, wherein three reference cells are assigned to a respective resistive memory cell, wherein the three reference cells comprise three different resistance values representing three different reference states between the individual memory states of the resistive memory cell, and wherein the second resistance range of the second device comprises the three different reference states.

18. The memory chip according to claim 17, wherein three reference cells are assigned to resistive memory cells arranged at a respective word line.

19. The memory chip according to claim 9, wherein the evaluation device comprises load elements assigned to the resistive memory cells and to the reference cells and a sense amplifier, wherein the electrical current in a respective bit line assigned to a respective resistive memory cell and in a respective bit line assigned to a respective reference cell causes a respective voltage drop at a respective load element assigned to the respective resistive memory cell and at a respective load element assigned to the respective reference cell, the respective voltage drop being sensed by the sense amplifier.

20. The memory chip according to claim 19, wherein each load element is a diode.

21. The memory chip according to claim 9, wherein each resistive memory cell comprises a resistive memory element and a selection transistor.

22. The memory chip according to claim 9, wherein each reference cell is a resistive memory cell switched into a reference state.

23. An electronic device comprising at least one memory chip, the memory chip comprising:
a plurality of word lines and bit lines;
a plurality of resistive memory cells, wherein a respective resistive memory cell is arranged at a cross point of a respective word line and a respective bit line and is configured to be switched between a highly resistive memory state and at least one lowly resistive memory state;
a plurality of reference cells, wherein a respective reference cell is arranged at a cross point of a respective word line and a respective bit line and comprises a respective resistance value representing a respective reference state;
a first device configured to apply a predetermined read voltage to a respective resistive memory cell, thereby causing an electrical current to flow in a respective bit line assigned to the respective resistive memory cell, wherein the first device generates the read voltage for a first resistance range, the first resistance range comprising the memory states of the respective resistive memory cell;
a second device configured to apply the predetermined read voltage to a respective reference cell, thereby causing an electrical current to flow in a respective bit line assigned to the respective reference cell, wherein the second device generates the read voltage for a second resistance range, the second resistance range being smaller in comparison to the first resistance range and comprising the respective reference state of the respective reference cell; and
an evaluation device configured to evaluate memory states of the resistive memory cells.

24. The electronic device according to claim 23, wherein the electronic device is a memory module.

25. The electronic device according to claim 23, wherein the electronic device is a main board.

26. The electronic device according to claim 23, wherein the electronic device is a printed circuit board.

27. A memory module, comprising:
a plurality of resistive memory cells, wherein a respective resistive memory cell is configured to be switched between a highly resistive memory state and at least one lowly resistive memory state;
a plurality of reference cells, wherein a respective reference cell comprises a respective resistance value representing a respective reference state;
a first device configured to apply a predetermined read voltage to a respective resistive memory cell, wherein the first device comprises a voltage regulation circuit which regulates a voltage applied to the respective resistive memory cell to the predetermined read voltage; and
a second device configured to apply the predetermined read voltage to a respective reference cell, wherein the second device comprises a transistor configured to be operated as a source follower to set the read voltage at the respective reference cell.

28. The memory module according to claim 27, wherein each resistive memory cell is one of a conductive bridging random access memory (CBRAM) memory cell and a phase change random access memory (PCRAM) memory cell.

29. A method of evaluating a memory state of a resistive memory cell configured to be switched between a highly resistive memory state and at least one lowly resistive memory state, the method comprising:
applying a predetermined read voltage to the resistive memory cell, wherein the read voltage is generated for a first resistance range, the first resistance range comprising the memory states of the resistive memory cell;
detecting an electrical quantity depending on an electrical current resulting from applying the read voltage to the resistive memory cell;
applying the predetermined read voltage to a reference cell, wherein the reference cell comprises a resistance value representing a reference state, and wherein the read voltage is generated for a second resistance range, the second resistance range being smaller in comparison to the first resistance range and comprising the reference state of the reference cell;
detecting an electrical reference quantity depending on an electrical current resulting from applying the read voltage to the reference cell; and
determining the memory state of the resistive memory cell based on a comparison of the electrical quantity and the electrical reference quantity.

30. The method according to claim 29, wherein the electrical quantity is a first voltage drop at a first load element assigned to the resistive memory cell and wherein the electrical reference quantity is a second voltage drop at a second load element assigned to the reference cell.

31. The method according to claim 29, wherein a voltage applied to the resistive memory cell is regulated to the predetermined read voltage.

32. The method according to claim 29, wherein the resistive memory cell is configured to be switched between the highly resistive memory state and three lowly resistive memory states.

33. The method according to claim 32, wherein three reference cells are assigned to the resistive memory cell, wherein the predetermined read voltage is applied to the three reference cells, the three reference cells comprising three different resistance values representing three different reference states between the individual memory states of the resistive memory cell, and wherein the second resistance range comprises the three different reference states.

34. The method according to claim 33, wherein three respective electrical reference quantities are detected depending on an electrical current resulting from applying the read voltage to the three respective reference cells, and wherein the memory state of the resistive memory cell is determined based on comparisons of the electrical quantity and the three respective electrical reference quantities.

* * * * *